US012626180B2

(12) United States Patent
Dees et al.

(10) Patent No.: US 12,626,180 B2
(45) Date of Patent: May 12, 2026

(54) COMPUTING DEVICE, METHOD AND COMPUTER PROGRAM PRODUCT FOR GENERATING TRAINING DATA FOR A MACHINE LEARNING SYSTEM

(71) Applicant: THE BOEING COMPANY, Chicago, IL (US)

(72) Inventors: Patrick Daniel Dees, Huntsville, AL (US); Helen Amelia Hawkins, Huntsville, AL (US); Taylor S. Loper, Huntsville, AL (US); Grant A. Rosario, Huntsville, AL (US)

(73) Assignee: The Boeing Company, Arlington, VA (US)

( * ) Notice: Subject to any disclaimer, the term of this patent is extended or adjusted under 35 U.S.C. 154(b) by 87 days.

(21) Appl. No.: 16/671,268

(22) Filed: Nov. 1, 2019

(65) Prior Publication Data

US 2021/0133502 A1     May 6, 2021

(51) Int. Cl.
*G06N 20/00* (2019.01)
*G06F 18/214* (2023.01)
(Continued)

(52) U.S. Cl.
CPC ......... *G06N 20/00* (2019.01); *G06F 18/2148* (2023.01); *G06F 18/24133* (2023.01); *G06F 30/20* (2020.01); *G06V 40/20* (2022.01)

(58) Field of Classification Search
CPC ..................... G06N 3/08; G06N 3/088; G06T 2207/20084; G06T 2207/20081; G06K 9/6256
See application file for complete search history.

(56) References Cited

U.S. PATENT DOCUMENTS 10,489,972 B2    11/2019  Atsmon
10,496,099 B2    12/2019  Wilkinson et al.
(Continued)

FOREIGN PATENT DOCUMENTS

CN          109643125 A    4/2019
CN          110070139 A    7/2019
WO    WO-2019/018471 A1    1/2019

OTHER PUBLICATIONS

Extended European Search Report for European Patent Application No. 20194827.0, Mar. 18, 2021, (11 pages), European Patent Office, Munich, Germany.
(Continued)

*Primary Examiner* — Raphael Schwartz
(74) *Attorney, Agent, or Firm* — Harrity & Harrity, LLP

(57)          ABSTRACT

A computing device, method and computer program product are provided to generate training data for a machine learning system including training data representative of one or more edge scenes. In the context of a computing device, the computing device includes a simulator configured in accordance with a sampling algorithm to create a plurality of different scenes, including one or more edge scenes, within a scenario that is at least partially defined by one or more parametric attributes. The computing device also includes a physics engine generate training data representative of the plurality of different scenes including the one or more edge scenes. The physics engine is configured to modify the one or more parametric attributes to generate additional and different training data based upon another plurality of different scenes created by the simulator within another scenario that is at least partially defined by one or more parametric attributes, as modified.

18 Claims, 1 Drawing Sheet

(51) Int. Cl.

| | |
|---|---|
| *G06F 18/2413* | (2023.01) |
| *G06F 30/20* | (2020.01) |
| *G06V 40/20* | (2022.01) |

(56) References Cited

U.S. PATENT DOCUMENTS

| | | | | |
|---|---|---|---|---|
| 2014/0322674 | A1* | 10/2014 | Livneh | G09B 9/40 |
| | | | | 434/30 |
| 2018/0275658 | A1* | 9/2018 | Iandola | G06F 30/20 |
| 2018/0293713 | A1 | 10/2018 | Vogels et al. | |
| 2018/0345496 | A1 | 12/2018 | Li et al. | |
| 2019/0107846 | A1* | 4/2019 | Roy | G08G 5/04 |
| 2019/0205667 | A1 | 7/2019 | Avidan et al. | |
| 2019/0303759 | A1 | 10/2019 | Farabet et al. | |
| 2020/0074266 | A1* | 3/2020 | Peake | G01S 17/931 |
| 2021/0078168 | A1* | 3/2021 | Mehnert | G06V 10/776 |

OTHER PUBLICATIONS

Yue, Xiangyu et al. "A LiDAR Point Cloud Generator: From a Virtual World to Autonomous Driving," arXiv:1804.00103v1, Mar. 31, 2018, (7 pages).

Communication pursuant to Article 94(3) EPC for European Patent Application No. 20194827.0, Jun. 5, 2024, (7 pages), European Patent Office, Munich, Germany.

Kongming, F., et al., "Uncertainty Analysis and Probabilistic Forecasting in Flood Prediction," 2019, pp. 29-30.

* cited by examiner

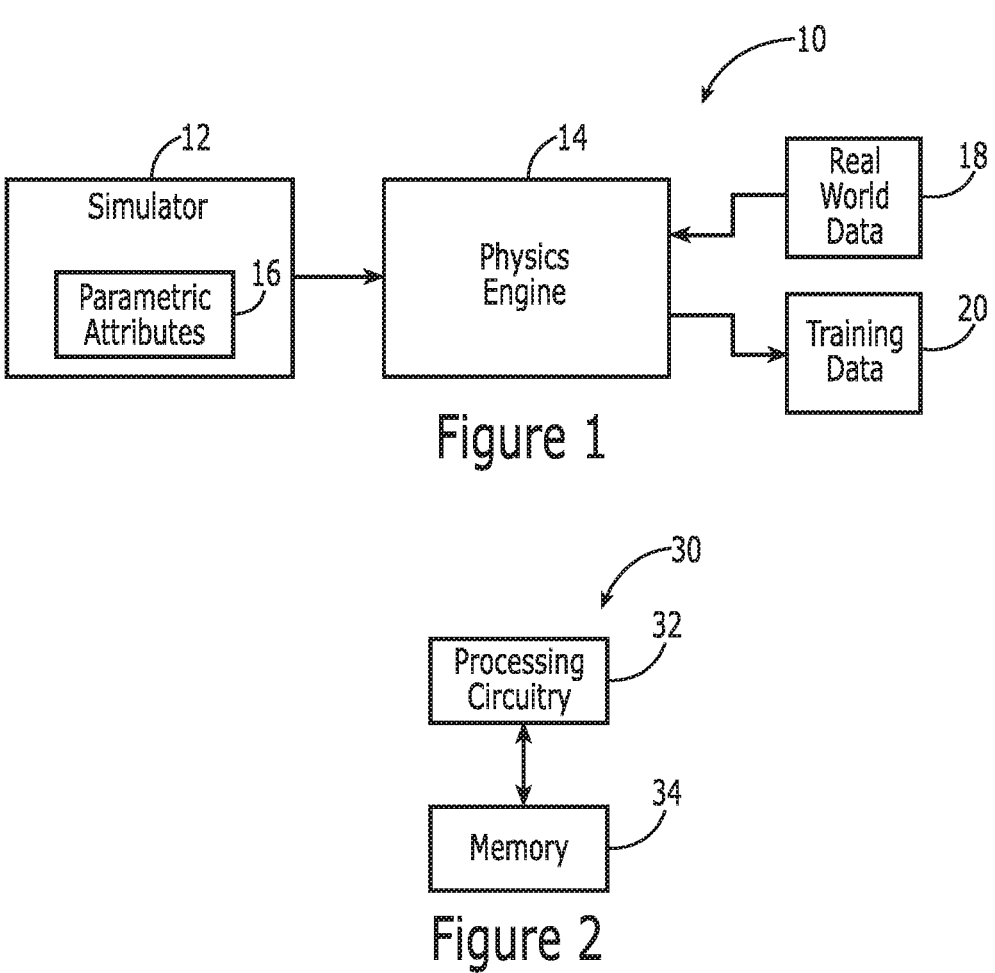
Figure 1
Figure 2
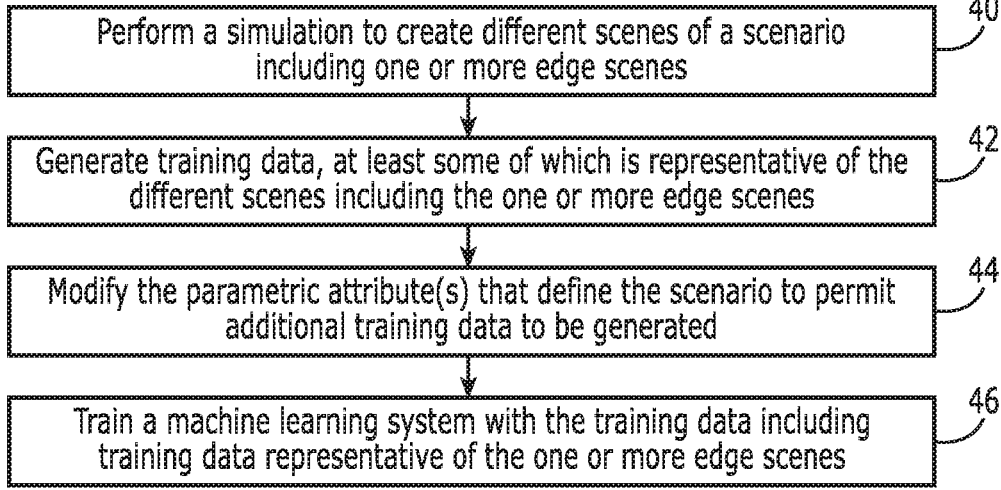
Figure 3

COMPUTING DEVICE, METHOD AND COMPUTER PROGRAM PRODUCT FOR GENERATING TRAINING DATA FOR A MACHINE LEARNING SYSTEM

TECHNOLOGICAL FIELD

The present disclosure relates generally to a computing device, a method and computer program product configured to generate training data for a machine learning system and, more particularly, to a computing device, a method and a computer program product for generating training data for a machine learning system with the training data being representative of a plurality of different scenes within a scenario including one or more edge scenes.

BACKGROUND

Machine learning is utilized in a number of applications with many more applications anticipated to be reliant upon machine learning in the future. For example, applications that utilize machine learning algorithms include applications configured to predict customer purchases, applications configured to identify objects in a scene and applications configured to protect against cyber-attacks, to name but a few. Machine learning systems must be trained in order to perform in an acceptable manner. As the minimum quantity of data required to train a machine learning algorithm to perform acceptably is unclear, many machine learning algorithms are trained upon a large quantity of data in order to increase the likelihood that the machine learning system will perform acceptably. As such, large quantities of data representative of the various scenarios that the machine learning system will encounter are required in order to train the machine learning systems.

A number of resources are available that provide data sets that may be used to train machine learning systems for various applications. For example, resources are available that provide data sets to train machine learning systems for object classification applications, for applications that must recognize humans in various poses and for applications that interact with complex urban environments. Additionally, data sets are available that contain sensor data to facilitate the development of autonomous vehicles. However, each of these data sets is static. As such, the data sets are useful for training purposes so long as every scenario for which the machine learning system is to be trained is included in the data set, but the machine learning system will not be trained on any scenario that is not included within the data set. Thus, an application incorporating or otherwise dependent upon a machine learning system that has been trained with a static data set may be unable to identify or appropriately react to any such scenario that was not included in the training data set.

The training data that is available for certain applications may be based upon real-world data. However, tools, such as simulators, have also been developed to generate artificial data sets for the training of machine learning systems. For example, the Car Learning to Act (CARLA) open source simulator is configured to create artificial data sets for autonomous driving research, the AirSim open source simulator from Microsoft, of Redmond, WA, USA, is configured to create artificial data sets for autonomous vehicles including drones and automobiles and the SynCity tool provided by CVEDIA PVE Ltd., of Singapore, is configured to create artificial data sets for other machine learning tasks. The artificial data sets created by these and other tools generally rely upon simulated input which, in at least some instances, may not be as detailed as the real-world data. This reduction in detail may be disadvantageous for machine learning systems that support certain applications, such as machine learning systems that support computer vision applications, that are reliant upon and that may make decisions dependent upon the analysis and/or identification of a fine level of detail.

As a result, machine learning systems that have been trained utilizing artificial data, such as the artificial data generated by tools, such as open source simulators, may not perform as well as corresponding machine learning systems that have been trained based upon real-world data. As such, reliance upon real-world data for the training of machine learning systems may be advantageous, but such real-world data may not be available for all scenarios that an application that includes or is otherwise reliant upon a machine learning system may encounter, such as scenarios that seldomly occur, e.g. scenarios that may be dangerous, illegal or otherwise have a low probability of occurrence.

BRIEF SUMMARY

A computing device, method and computer program product are provided in accordance with an example in order to generate training data for a machine learning system. The computing device, method and computer program product are configured to generate training data representative of a plurality of different scenes within a scenario including one or more edge scenes, that is, those scenes that may not be represented by real-world data since the scenes may represent behavior that is dangerous or illegal or that otherwise have a low probability of occurrence, but for which it is desirable to train the machine learning system such that the machine learning system or an application that is reliant upon the machine learning system may respond in a more appropriate or at least a more predictable manner should the edge scene be encountered. As a result, the computing device, method and computer program product of an example may generate not only artificial training data representative of a plurality of different scenes within a scenario including one or more edge scenes, but also training data representative of a scenario that is based upon real-world data such that a machine learning system may be trained in a more robust manner in order to increase the likelihood that the machine learning system and, in turn, an application that incorporates or is otherwise reliant upon the machine learning system will perform in an acceptable manner.

In an example, a computing device is provided that is configured to generate training data for a machine learning system. The computing device includes a simulator configured in accordance with a sampling algorithm to create a plurality of different scenes within a scenario that is at least partially defined by one or more parametric attributes. The plurality of scenes created by the simulator include one or more edge scenes. The computing device also includes a physics engine, responsive to the simulator, configured to generate training data representative of the plurality of different scenes within the scenario including the one or more edge scenes. The physics engine is configured to modify the one or more parametric attributes in order to generate additional and different training data based upon another plurality of different scenes created by the simulator within another scenario that is at least partially defined by one or more parametric attributes, as modified.

The physics engine may be configured to generate training data representative of the scenario based upon real world data. The simulator of this example may be configured to create the edge scene that is not represented by the real world data. In an example, the physics engine is configured to generate training data representative of the scenario based on photo-realistic models. In an example, the one or more parametric attributes at least partially define performance or behavior within the scenario or an environment of the scenario. In another example, the one or more parametric attributes define one or more properties of one or more sensors.

In another example, a method is provided that is configured to generate training data for a machine learning system. The method includes performing a simulation in accordance with a sampling algorithm to create a plurality of different scenes within a scenario that is at least partially defined by one or more parametric attributes. In performing the simulation, the method includes creating one or more edge scenes. Responsive to the simulation, the method also includes generating training data representative of the plurality of different scenes within the scenario including the one or more edge scenes. The method further includes modifying the one or more parametric attributes in order to generate additional and different training data based upon another plurality of different scenes created by the simulation within another scenario that is at least partially defined by one or more parametric attributes, as modified.

The method may generate the training data by generating training data representative of the scenario based upon real world data. In this example embodiment, the simulation includes creating the one or more edge scenes that is not represented by the real world data. The method of an example generates the training data by generating training data representative of the scenario based on photo-realistic models. In an example, the one or more parametric attributes at least partially define performance or behavior within the scenario or an environment of the scenario. In another example, the one or more parametric attributes define one or more properties of one or more sensors. The method of an example also includes training the machine learning system with the training data representative of the plurality of different scenes within the scenario including the one or more edge scenes.

In a further example, a computer program product is provided that is configured to generate training data for a machine learning system. The computer program product comprises a non-transitory computer readable medium having program code stored thereon with the program code including program code instructions configured, upon execution, to perform a simulation in accordance with a sampling algorithm to create a plurality of different scenes within a scenario that is at least partially defined by one or more parametric attributes. The simulation is performed so as to create one or more edge scenes. The program code also includes program code instructions, responsive to the simulation, to generate training data representative of the plurality of different scenes within the scenario including the one or more edge scenes. The program code additional includes program code instructions to modify the one or more parametric attributes in order to generate additional and different training data based upon another plurality of different scenes created by the simulation within another scenario that is at least partially defined by one or more parametric attributes, as modified.

The program code instructions configured to generate the training data may include program code instructions configured to generate training data representative of the scenario based upon real world data. In this example, the program code instructions configured to perform the simulation may include program code instructions configured to create the edge scene that is not represented by the real world data. The program code instructions configured to generate the training data in accordance with an example include program code instructions configured to generate training data representative of the scenario based on photo-realistic models. In an example, the one or more parametric attributes at least partially define performance or behavior within the scenario or an environment of the scenario. In another example, the one or more parametric attributes define one or more properties of one or more sensors. The program code of an example also includes program code instructions configured to train the machine learning system with the training data representative of the plurality of different scenes within the scenario including the one or more edge scenes.

BRIEF DESCRIPTION OF THE DRAWINGS

Having described certain examples of the present disclosure in general terms above, reference will now be made to the accompanying drawings, which are not necessarily drawn to scale and wherein:

FIG. 1 is a block diagram illustrating a computing device in accordance with an example of the present disclosure;

FIG. 2 is a block diagram of a computer that may be configured in order to implement the simulator and/or the physics engine of the computing device of FIG. 1 in accordance with an example of the present disclosure; and FIG. 3 is a flowchart illustrating the operations performed, such as by the computing device of FIG. 1, in accordance with an example of the present disclosure.

DETAILED DESCRIPTION

Some examples of the present disclosure will now be described more fully hereinafter with reference to the accompanying drawings, in which some, but not all examples of the present disclosure are shown. Indeed, the present disclosure may be embodied in many different forms and should not be construed as limited to the examples set forth herein; rather, these examples are provided so that this disclosure will satisfy applicable legal requirements. Like numbers refer to like elements throughout. As used herein, the terms "data," "content," "information," and similar terms may be used interchangeably to refer to data capable of being transmitted, received, and/or stored in accordance with examples of the present disclosure. Thus, use of any such terms should not be taken to limit the spirit and scope of the present disclosure.

A computing device, a method and a computer program product are provided in accordance with an example in order to generate training data for a machine learning system. The machine learning system may be utilized by any of a wide variety of applications. For example, applications that may include or otherwise be dependent upon a machine learning system may include applications relating to the control of autonomous vehicles, applications relating to the protection of computer network against a cyber attack, applications configured to respond to hardware or software failures, applications designed to predict the impact of various weather systems including tornados and hurricanes and applications associated with like control of aircraft, to name but a few. In order to provide for more robust training of a machine learning system and, as a result, improved or at least more predictable performance by an application that is dependent upon the machine learning system, the computing device, method and computer program product of an example are configured to provide training data that is representative of a plurality of views and interactions as to mirror existing data sets with the addition of one or more edge scenes, that is, a scene that is not represented by real world data. In many instances, an edge scene is not represented by real world data because the edge scene has a low probability of occurrence, such as in instances in which the activity represented by the edge scene is illegal or danger-ous.

In an example, the training data representative of an edge scene is based upon photo-realistic models in order to increase the likelihood that the training data will accurately represent the edge scene if the edge scene were ever to occur in the real world. Moreover, the computing device, method and computer program product may not only simulate various scenes based solely on models of the simulated environment, including edge scenes, in order to generate training data, but may also generate training data based upon real world data, thereby further creating a large or fulsome set of training data in order to permit the machine learning system to be more completely trained with both artificial data and real world data.

Referring now to FIG. 1, a computing device 10 is depicted that is configured to generate training data 20 that is utilized to train a machine learning system in accordance with an example. The computing device 10 includes a simulator 12 and a physics engine 14, in communication with and responsive to the simulator. The simulator 12 is embodied by a computer, such as described below, that is configured in accordance with a sampling algorithm to generate a set of samples that may be provided to a com-putational algorithm to generate a result.

For example, a scenario may be defined by a plurality of parametric attributes 16, each of which may vary across a range of values, either continuous or discrete. The simulator 12 is configured in accordance with a sampling algorithm to generate a set of samples from the ranges of each parametric attribute in an algorithmic fashion, such as in a quasi-repeatable and structured manner. Examples of the statistical algorithm implemented by the simulator 12 include deter-ministic and/or stochastic algorithms. For example, the statistical algorithm implemented by the simulator 12 may include Design of Experiments sampling algorithms, such as Box-Behnken and Face-Centered Cubic algorithms, which are deterministic, and Monte Carlo and Latin-Hypercube algorithms, which are stochastic. Each set of samples of the plurality of parametric attributes defines a respective scene of the scenario and is provided by the sampling algorithm of the simulator 12 to a computational algorithm generate a corresponding result. This process may be repeated for a plurality of scenes of the scenario, each of which is defined by a set of samples of the parametric attributes 16 which is then provided to the computational algorithm to generate a corresponding output.

In an example, the simulator 12 is configured in accor-dance with a Monte Carlo sampling algorithm in order to obtain repeated random samples, that is, the sets of samples, that may be provided to a computational algorithm to generate a result. In this example, a scenario may be defined by a plurality of parametric attributes 16, each of which may vary across a range of values according to a respective probability distribution. A simulator 12 is configured in accordance with a Monte Carlo sampling algorithm to randomly sample a value for each parametric attribute 16 of the scenario in accordance with the probability distribution of the respective parametric attribute. The set of samples of the plurality of parametric attributes 16 of the scenario defines a respective scene of the scenario and are provided by the simulator 12 to a computational algorithm in order to generate a corresponding result. This process may be repeated for a plurality of scenes of the scenario, each of which is defined by a set of random samples of the para-metric attributes 16 which is then provided to the compu-tational algorithm to generate a corresponding output.

The parametric attributes 16 that define a scenario vary depending upon the type of training data 20 and, in turn, the application that the machine learning system will support. In this regard, the parametric attributes 16 at least partially define the performance or behavior within a scenario or the environment of the scenario. The parametric attributes 16 of one example define one or more properties of one or more sensors that gather data relating to the scenario, such as a camera, a speed sensor, a heading sensor or the like. As an example and in conjunction with an application associated with the control of an autonomous vehicle, the parametric attributes 16 may include the speed of the vehicle, the heading of the vehicle, the location of the vehicle, the location, speed and heading of other nearby vehicles, the location and direction of travel of one or more nearby pedestrians, characteristics of the roadway along which the vehicle is traveling including the curvature of the roadway and the like.

The plurality of scenes created by the simulator 12 for the parametric attributes 16 of a scenario include one or more edge scenes. In an example, an edge scene that is created by the simulator 12 is a scene that is not represented by real world data 18. For example, the edge scene may be a scene within the scenario that is feasible, that is, a scene which may occur, but that is not reflected by real world data 18 of the scenario as a result of the danger associated with the edge scene, the illegality of the edge scene or the extremely low probability of the occurrence of the edge scene in the real world. Examples of an edge scene depend upon the type of training data 20 that is generated which depends, in turn, upon the application with which the machine learning sys-tem is to be employed. In conjunction with an application configured to provide control for autonomous vehicles, for example, the edge scene may be a scene in which a pedes-trian steps out in front of an oncoming autonomous vehicle or a scene in which another vehicle runs a red light and enters the same intersection as the autonomous vehicle as the real world data 18 likely does not include data repre-sentative of these dangerous situations. In relation to an application that at least partially controls the flight of an aircraft and that is supported by a machine learning system, the edge scene may relate to the control of the aircraft in response to a catastrophic hardware or software failure. As another example, for an application that assists with the guidance of a ship or other marine vehicle and that is supported by a machine learning system, the edge scene may relate to the guidance of the ship or other marine vehicle in response to the detection of an oncoming torpedo or the presence of an enemy submarine. Still further, in conjunc-tion with an application that predicts the behavior of weather systems, an edge scene may represent the presence of a tornado or a hurricane.

The physics engine 14 is also embodied by a computer, such as described below and, in one example, the same computer as that which embodies the simulator 12. The physics engine 14 is configured to simulate one or more physical systems in order to determine the response of the one or more physical systems to a particular input. The physics engine 14 may be employed in a variety of applications including, for example, in conjunction with the generation of a graphical representation, such as utilized in conjunction with computer graphics. Although various physics engines 14 may be employed, one example of a physics engine that may be utilized is the Unreal Engine developed by Epic Games in Cary, North Carolina, USA.

By simulating the response of one or more physical systems to the plurality of scenes generated by the simulator 12, the physics engine 14 is configured to generate training data 20 representative of the plurality of different scenes within this scenario, including the one or more edge scenes, In this regard, the physics engine 14 receives the values of the one or more parametric attributes 16 from the simulator 12 that define a respective scene and then generates training data 20 representative of the respective scene. The physics engine 14 of an example is configured to generate a plurality of views from within the environment defined by each sample generated by the simulator 12 so as to permit additional and different training data 20 to be generated. In this regard, following modification to one or more parametric attributes 16 as brought about by transitioning from one sample generated by the simulator 12 to another sample, the physics engine 14 is configured to create another plurality of different scenes within the environment defined by a respective sample. For example, the physics engine 14 may be configured to modify certain conditions of the environment as defined by one or more parametric attributes in order to create different scenes, such as by altering whether rain is simulated or not, or whether the ambient lighting is to emulate day or night. In this regard, the physics engine 14 may be considered to initially receive a selection as to whether rain is to be simulated or not and/or the type of ambient lighting, but the physics engine may thereafter alter the parametric attributes defined by these selections in order to create different scenes in addition to those created based upon the initial selections. Thus, the physics engine 14, in combination with the simulator 12, may create a more robust set of training data 20 representative of different scenarios and different scenes within the different scenarios based upon the modification of the parametric attributes defining the respective scenarios.

The physics engine 14 is configured to generate the training data 20 representative of the scenario based not only on the scenes created by the simulator 12, but also based upon photo-realistic models of the scenario or the environment of the scenario. By utilizing photo-realistic models to insure the accuracy of the textures and the physical dimensions in combination with the values of the one or more parametric attributes 16 that define the scene created by the simulator 12, the resulting training data 20 may be accurate and reliable even though the training data is simulated. In addition to the generation of training data 20 based upon the simulation of a scenario by the simulator 12, the physics engine 14 of an example is also configured to generate training data representative of the scenario based upon real world data 18. Thus, in the example application that relates to the control of an autonomous vehicle, the physics engine 14 is configured to generate training data 20 representative of a scenario in which a vehicle is driving along a roadway based upon real world data 18, such as images of vehicles traveling along the roadway, as well as training data based upon a scene within the scenario that has been created by the simulator 12, such as an edge scene that is not represented by the real world data, e.g., a scene in which a pedestrian steps in front of the oncoming vehicle. By generating training data 20 representative of the same scenario based upon both real world data 18 and a simulated scene, including an edge scene, created by the simulator 12, the physics engine 14 is configured to generate a more robust set of training data, thereby resulting in a more fulsome training of a machine learning system and more complete and accurate results following execution of an application that utilizes the machine learning system.

Referring now to FIG. 2, a computer 30 that may be specifically configured in order to serve as the simulator 12, the physics engine 14 or both the simulator and the physics engine is depicted. The computer 30 may be any of a wide variety of different types of computers including a server, a computer workstation, a gaming system, a plurality of networked computers or the like. Regardless of the manner in which the computer 30 is embodied, the computer of this example includes processing circuitry 32 and an associated memory device 34.

The processing circuitry 32 may be embodied in a number of different ways and may, for example, include one or more processing devices configured to perform independently. Additionally or alternatively, the processing circuitry 32 may include one or more processors configured in tandem via a bus to enable independent execution of software instructions, pipelining, and/or multithreading. The use of the terms "processor" or "processing circuitry" may be understood to include a single core processor, a multi-core processor, multiple processors, remote or "cloud" processors, or any combination thereof.

In an example, the processing circuitry 32 may include one or more dedicated processors, controllers, specially configured field programmable gate arrays (FPGAs), or application specific interface circuits (ASICs) to perform its corresponding functions. The processing circuitry 32 may additionally or alternatively be implemented using a processor executing software stored in a memory (e.g., memory 34). In this fashion, the processing circuitry 32 may therefore be implemented using special-purpose components implemented purely via hardware design or may utilize hardware components that execute computer software designed to facilitate performance of the functions of the processing circuitry.

The processing circuitry 32 may also include or be associated with memory 34 and the processing circuitry of this example may be configured to execute software instructions stored in the memory or otherwise accessible to the processing circuitry. In this example, the memory 34 is non-transitory and may include, for example, one or more volatile and/or non-volatile memories. In other words, for example, the memory 34 may be an electronic storage device (e.g., a computer readable storage medium). The memory 34 may be configured to store information, data, content, applications, software instructions, or the like, for enabling the processing circuitry 32 to carry out various functions in accordance with examples contemplated herein. Alternatively or additionally, the processing circuitry 32 may be configured to execute hard-coded functionality. As such, whether configured by hardware or software methods, or by a combination of hardware with software, the processing circuitry 32 may represent an entity (e.g., physically embodied in circuitry) capable of performing operations according to an example of the present disclosure while configured accordingly. Alternatively, as another example, when the processing circuitry 32 is embodied as an executor of software instructions, the software instructions may specifically configure the circuitry to perform the algorithms and/or operations described herein when the software instructions are executed.

Referring now to FIG. 3, the operations performed, such as by the computing device 10 of FIG. 1, in accordance with an example are depicted. As shown in block 40, the computing device 10, such as the simulator 12, is configured to perform a simulation to create a plurality of different scenes within a scenario. The scenario is at least partially defined by one or more parametric attributes 16, each of has a value selected from the corresponding range. Thus, the creation of the plurality of difference scenes includes the determination of different sets of values for the one or more parametric attributes 16, such as a result of drawing, for each parametric attribute, different values from the corresponding range. In performing the simulation, the computing device 10, such as the simulator 12, is configured to create one or more edge scenes, that is, one or more scenes that are not represented by real world data 18.

In response to the simulator 12, the computing device 10, such as the physics engine 14, is configured to generate training data 20 representative of the plurality of different scenes within this scenario including the one or more edge scenes. See block 42 of FIG. 3. For example, the computing device 10, such as the physics engine 14, may be configured to generate training data 20 representative of a scene simulated by the simulator 12 based on a photo-realistic model such that the resulting training data accurately reflects the simulated scene. In an example, the computing device 10, such as the physics engine 14, not only generates training data 20 representative of the plurality of different scenes created by the simulator 12, but also generates training data representative of the scenario based upon real world data 18. In some examples, the training data 20 generated by the physics engine 14 and, more particularly, objects represented by the training data may be labeled, such as one or more individuals who have experience with the subject matter of the training data, in order to facilitate the subsequent training of a machine learning system with the labeled training data.

As shown in block 44 of FIG. 3, the computing device 10, such as the physics engine 14, is also configured to modify the one or more parametric attributes 16 in order to generate additional and different training data 20 based upon another plurality of scenes created by the simulator 12 within another scenario that is at least partially defined by one or more parametric attributes, as now modified. As such, a more robust and completed set of training data 20 may be generated.

As shown in block 46, a machine learning system may then be trained, such as by the computing device 10 or another training computer. In training the machine learning system, the training data 20 that has been generated representative of the plurality of different scenes within the scenario including the one or more edge scenes is utilized. As such, the machine learning system is trained utilizing a more robust set of training data 20 such that the response of the machine learning system is more accurate and predictable. As a result, an application that relies upon the machine learning system may, in turn, provide more complete responses, both to situations represented by real world data 18 and situations that were not previously represented real world data and which, instead, are the product of the simulation.

FIG. 3 illustrates a flowchart describing the operation of apparatuses, methods, and computer program products according to examples of the disclosure. It will be understood that each block of the flowchart, and combinations of blocks in the flowchart, may be implemented by various means, embodied as hardware, firmware, circuitry, and/or other devices associated with execution of software including one or more software instructions. For example, one or more of the operations described above may be embodied by software instructions. In this regard, the software instructions which embody the procedures described above may be stored by a memory 34 of a computing device 10 employing an example of the present disclosure and executed by processing circuitry 32 of the computing device. As will be appreciated, any such software instructions may be loaded onto a computer or other programmable apparatus (e.g., hardware) to produce a machine, such that the resulting computer or other programmable apparatus implements the functions specified in the flowchart blocks. These software instructions may also be stored in a computer-readable memory that may direct a computer or other programmable apparatus to function in a particular manner, such that the software instructions stored in the computer-readable memory produce an article of manufacture, the execution of which implements the functions specified in the flowchart blocks. The software instructions may also be loaded onto a computer or other programmable apparatus to cause a series of operations to be performed on the computer or other programmable apparatus to produce a computer-implemented process such that the software instructions executed on the computer or other programmable apparatus provide operations for implementing the functions specified in the flowchart blocks.

The flowchart blocks support combinations of means for performing the specified functions and combinations of operations for performing the specified functions. It will be understood that one or more blocks of the flowchart, and combinations of blocks in the flowchart, can be implemented by special purpose hardware-based computer systems which perform the specified functions, or combinations of special purpose hardware and software instructions.

In some examples, some of the operations above may be modified or further amplified. Furthermore, in some examples, additional optional operations may be included. Modifications, amplifications, or additions to the operations above may be performed in any order and in any combination.

Many modifications and other examples of the present disclosure set forth herein will come to mind to one skilled in the art to which the present disclosure pertains having the benefit of the teachings presented in the foregoing descriptions and the associated drawings. Therefore, it is to be understood that the present disclosure is not to be limited to the specific examples disclosed and that modifications and other examples are intended to be included within the scope of the appended claims. Moreover, although the foregoing descriptions and the associated drawings describe examples in the context of certain combinations of elements and/or functions, it should be appreciated that different combinations of elements and/or functions may be provided by alternative examples without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purpose of limitation.

That which is claimed:

1. A computing device configured to generate artificial training data for a machine learning system, the computing device comprising:

a simulator configured in accordance with a sampling algorithm to create a plurality of different scenes within a scenario that is at least partially defined by one or more parametric attributes, wherein the plurality of different scenes created by the simulator include one or more edge scenes, and wherein the one or more parametric attributes define respective conditions of an environment so as to at least partially define the scenario within which the plurality of different scenes are created; and a physics engine configured to receive values of the one or more parametric attributes from the simulator and generate artificial training data representative of the plurality of different scenes within the scenario, including the one or more edge scenes, wherein objects represented by the artificial training data are configured to be labeled by one or more individuals to facilitate training of the machine learning system with labeled training data, and wherein the one or more edge scenes comprise an edge scene that is not reflected by real world data and that is based on photo-realistic models in association with the edge scene not being reflected by the real world data, wherein the physics engine is configured to modify the one or more parametric attributes, by altering a weather characteristic of the one or more parametric attributes, in order to generate additional and different artificial training data based upon another plurality of different scenes created by the simulator within another scenario that is at least partially defined by the one or more modified parametric attributes, wherein the physics engine is configured to modify the one or more parametric attributes by random sampling of a value for a respective parametric attribute of the scenario in accordance with a probability distribution of the respective parametric attribute, and wherein the random sampling of the value is based on a Box-Behnken algorithm or a Face-Centered Cubic algorithm.

2. The computing device according to claim 1, wherein the physics engine is configured to generate artificial training data representative of the scenario based on the photo-realistic models to ensure accuracy of textures and physical dimensions.

3. The computing device according to claim 1, wherein the one or more parametric attributes comprise one or more of: a speed of a vehicle in the environment, a heading of the vehicle, a location of the vehicle, a location, speed and heading of other nearby vehicles, a location and direction of travel of one or more nearby pedestrians, or characteristics of a roadway along which the vehicle is traveling including a curvature of the roadway.

4. The computing device according to claim 1, wherein the edge scene is not reflected by the real world data based on a low probability of an occurrence of the edge scene in the real world data.

5. The computing device according to claim 1, wherein the artificial training data is representative of the plurality of different scenes within the scenario comprise artificial training data representative of flight of an aircraft through an environment.

6. The computing device according to claim 1, wherein the physics engine configured to modify the one or more parametric attributes is configured to create another plurality of different scenes within the environment defined by a respective sample brought about by transitioning from one sample generated by the simulator to another sample.

7. The computing device according to claim 1, wherein the edge scene relates to detection of an oncoming weapon.

8. A method for generating artificial training data for a machine learning system, the method comprising:

performing, by a simulator, a simulation in accordance with a sampling algorithm to create a plurality of different scenes within a scenario that is at least partially defined by one or more parametric attributes, wherein performing the simulation comprises creating one or more edge scenes, and wherein the one or more parametric attributes define respective conditions of an environment so as to at least partially define the scenario within which the plurality of different scenes are created;

receiving, at a physics engine and from the simulator, values of the one or more parametric attributes;

generating, by the physics engine, artificial training data representative of the plurality of different scenes within the scenario, including the one or more edge scenes, wherein objects represented by the artificial training data are configured to be labeled by one or more individuals to facilitate training of the machine learning system with labeled training data, and wherein the one or more edge scenes comprise an edge scene that is not reflected by real world data and that is based on photo-realistic models in association with the edge scene not being reflected by the real world data; and modifying, by the physics engine, the one or more parametric attributes, by altering a weather characteristic of the one or more parametric attributes, in order to generate additional and different artificial training data based upon another plurality of different scenes created by the simulation within another scenario that is at least partially defined by the one or more modified parametric attributes, wherein modifying the one or more parametric attributes comprises random sampling of a value for a respective parametric attribute of the scenario in accordance with a probability distribution of the respective parametric attribute, and wherein the random sampling of the value is based on a Box-Behnken algorithm or a Face-Centered Cubic algorithm.

9. The method according to claim 8, wherein generating the artificial training data comprises generating artificial training data representative of the scenario based on the photo-realistic models to ensure accuracy of textures and physical dimensions.

10. The method according to claim 8, further comprising training the machine learning system with the artificial training data representative of the plurality of different scenes within the scenario including the one or more edge scenes.

11. The method according to claim 8, wherein the parametric attributes comprise one or more of properties of a camera, properties of a speed sensor, or properties of a heading sensor.

12. The method according to claim 8, wherein the one or more parametric attributes comprise one or more of: a speed of a vehicle in the environment, a heading of the vehicle, a location of the vehicle, a location, speed and heading of other nearby vehicles, a location and direction of travel of one or more nearby pedestrians, or characteristics of a roadway along which the vehicle is traveling including a curvature of the roadway.

13

13. A computer program product configured to generate artificial training data for a machine learning system, the computer program product comprising a non-transitory computer readable medium having program code stored thereon, the program code comprising program code instructions configured, upon execution, to:

perform, by a simulator, a simulation in accordance with a sampling algorithm to create a plurality of different scenes within a scenario that is at least partially defined by one or more parametric attributes, wherein the simulation is performed so as to create one or more edge scenes, and wherein the one or more parametric attributes define respective conditions of an environment so as to at least partially define the scenario within which the plurality of different scenes are created;

receive, at a physics engine and from the simulator, values of the one or more parametric attributes;

generate, by the physics engine, artificial training data representative of the plurality of different scenes within the scenario, including the one or more edge scenes, wherein objects represented by the artificial training data are configured to be labeled by one or more individuals to facilitate training of the machine learning system with labeled training data, and wherein the one or more edge scenes comprises an edge scene that is not reflected by real world data and that is based on photo-realistic models in association with the edge scene not being reflected by the real world data; and modify, by the physics engine, the one or more parametric attributes, by altering a weather characteristic of the one or more parametric attributes, in order to generate additional and different artificial training data based upon another plurality of different scenes created by the simulation within another scenario that is at least partially defined by the one or more modified parametric attributes,

wherein the program code instructions configured to modify the one or more parametric attributes comprise program code instructions configured to randomly sample a value for a respective parametric attribute of the scenario in accordance with a probability distribution of the respective parametric attribute, and wherein random sampling of the value is based on a Box-Behnken algorithm or a Face-Centered Cubic algorithm.

14. The computer program product according to claim 13, wherein the program code instructions configured to generate the artificial training data comprise program code instructions configured to generate artificial training data representative of the scenario based upon real world data.

15. The computer program product according to claim 13, wherein the program code instructions configured to generate the artificial training data comprise program code instructions configured to generate artificial training data representative of the scenario based on the photo-realistic models to ensure accuracy of textures and physical dimensions.

16. The computer program product according to claim 13, wherein the one or more parametric attributes define one or more properties of one or more sensors.

17. The computer program product according to claim 13, wherein the program code further comprises program code instructions configured to train the machine learning system with the artificial training data representative of the plurality of different scenes within the scenario including the one or more edge scenes.

18. The computer program product according to claim 13, wherein the parametric attributes comprise one or more of properties of a camera, properties of a speed sensor, or properties of a heading sensor.

* * * * *